(12) United States Patent
Malik et al.

(10) Patent No.: US 6,635,526 B1
(45) Date of Patent: Oct. 21, 2003

(54) STRUCTURE AND METHOD FOR DUAL WORK FUNCTION LOGIC DEVICES IN VERTICAL DRAM PROCESS

(75) Inventors: Rajeev Malik, Pleasantville, NY (US); Rama Divakaruni, Ossining, NY (US); Rajesh Rengarajan, Wappingers Falls, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/165,171

(22) Filed: Jun. 7, 2002

(51) Int. Cl.[7] ........................................... H01L 21/8242
(52) U.S. Cl. ..................... 438/243; 438/386; 438/247
(58) Field of Search ............................... 438/243–249, 438/386–392

(56) References Cited

U.S. PATENT DOCUMENTS

| | | | |
|---|---|---|---|
| 4,673,962 A | 6/1987 | Chatterjee et al. | |
| 5,543,348 A | 8/1996 | Hammerl et al. | |
| 5,563,085 A | * 10/1996 | Kohyama | 438/245 |
| 5,656,535 A | 8/1997 | Ho et al. | |
| 5,861,649 A | * 1/1999 | Yoshida et al. | 257/301 |
| 6,153,902 A | 11/2000 | Furukawa et al. | |
| 6,222,218 B1 | 4/2001 | Jammy et al. | |
| 6,258,659 B1 | 7/2001 | Gruening et al. | |
| 6,261,894 B1 | 7/2001 | Mandelman et al. | |
| 6,284,593 B1 | 9/2001 | Mandelman et al. | |
| 6,333,533 B1 | 12/2001 | Furukawa et al. | |

* cited by examiner

*Primary Examiner*—Jey Tsai
(74) *Attorney, Agent, or Firm*—Thomas R. FitzGerald, Esq.

(57) ABSTRACT

Dual work function transistors are provided in a cmos support area 14 with an embedded vertical dram array 12. A wordline layer 54, and nitride cap layer 56 cover the dram array 12 and a gate oxide layer 42 and an undoped polysilicon layer 44 cover the support area 14. A common mask is applied and patterned over the substrate to define the wordlines line structures in the dram array 12 and the gate structures in the support 14. The unwanted portions of the layers 54, 56, 42 and 44 are removed by etching.

20 Claims, 3 Drawing Sheets

STRUCTURE AND METHOD FOR DUAL WORK FUNCTION LOGIC DEVICES IN VERTICAL DRAM PROCESS

FIELD OF THE INVENTION

The present invention relates to semiconductor memory device manufacturing, and more particularly to methods for forming dual work function high-performance support metal oxide semiconductor field effect transistors (MOSFETs) in an embedded dynamic random access memory (EDRAM) array.

BACKGROUND OF THE INVENTION

Dual work function devices are becoming increasingly common in CMOS devices to provide enhanced PMOS performance. A transistor consists of a gate, a source, and a drain. In dual work function devices commonly practiced in the art, if the source and drain are doped N+, the polysilicon gate must also be doped n-type. Conversely, if the source and drain are doped P+, the polysilicon gate is doped p-type.

As devices shrink in size, more devices as well as devices of different types can be integrated onto the same substrate to provide electronic systems on a single substrate. These so-called systems on chip (SOC) further enhance performance of electronic products. Now it is possible to provide both high speed logic as well has high density dynamic random access memories (DRAM) on a single substrate.

Most DRAM circuits emphasize circuit density and reduced cost. In contrast, logic circuits emphasize speed. Dual work function logic devices are faster than single work function devices but are more complex to fabricate. In contrast, single work function devices are easier to fabricate and are used with dense memory arrays in conventional DRAMS. Until recently, most DRAMs were fabricated with single work function devices and logic products, such as microprocessors, were fabricated with dual work function devices. Adding dual work function devices to a process flow also adds to the complexity and relative cost of fabricating the SOC. For instance, memory circuits achieve increased density requirements by employing self-aligned contacts (borderless bit line contacts), which are easily implemented in a process having a single type, e.g. typically N+ type, gate work function. A buried-channel type PMOSFET is used in creating DRAMs because it permits a single work function gate conductor, N+, to be used throughout the fabrication process. This lowers the cost of fabricating DRAMs, but at the expense of creating an inferior performing PMOSFET. On the other hand, logic circuits require both P+ and N+ gated MOSFETs in order to achieve the necessary switching speeds. P+ and N+ gate conductor devices are highly desirable for EDRAM products.

EDRAM applications demand both the utmost in high-performance CMOS (complementary metal oxide semiconductor) logic devices and high-density DRAM arrays. High-performance CMOS logic devices require low-resistance gate conductors and source/drain diffusions (salicidation), which drive processes that are costly and difficult to integrate with high-density DRAM processes. For example, salicided gates and source/drain regions greatly complicate the processes for forming array MOSFETs since the array MOSFETs need bitline contacts which are borderless to adjacent wordline conductors. Also, salicided junctions in the array may result in increased current leakage of the memory device.

A DRAM circuit will usually include an array of memory cells interconnected by rows and columns, which are known as wordlines and bitlines, respectively. Reading data from, or writing data to, memory cells is achieved by activating selected wordlines and bitlines. Typically, a DRAM memory cell comprises a MOSFET connected to a capacitor. The capacitor includes gate and diffusion regions which are referred to as either drain or source regions, depending on the operation of the transistor.

There are different types of MOSFETs. A planar MOSFET is a transistor where a surface of the channel region of the transistor is generally parallel to the primary surface of the substrate. A vertical MOSFET is a transistor where a surface of the channel region of the transistor is generally perpendicular to the primary surface of the substrate. A trench MOSFET is a transistor where a surface of the channel region of the transistor is not parallel to the primary surface of the substrate and the channel region lies within the substrate. For a trench MOSFET, the surface of the channel region is usually perpendicular to the primary surface, although this is not required.

Trench capacitors are frequently used with DRAM cells. A trench capacitor is a three-dimensional structure formed into a silicon substrate. It is normally formed by etching trenches of various dimensions into the silicon substrate. Trenches commonly have N+ doped polysilicon as one plate of the capacitor (a storage node). The other plate of the capacitor is formed usually by diffusing N+ dopants out from a dopant source into a portion of the substrate surrounding the lower part of the trench. Between these two plates, a dielectric layer is placed to form the capacitor.

There is a continuing need for more efficient and less costly techniques to fabricate systems on chip. Consider, for example, the processes shown in U.S. Pat. Nos. 6,261,894 and 6,258,659. Both of them show techniques for fabricating embedded memory arrays with logic support areas. In both cases the gates for the wordline in the array and the gates for the logic devices are separately formed. In effect, two separate processes, a memory forming process and a support (logic) process are separately performed on the substrate. While the array is formed, the support is masked and then the array is masked while the support is formed. If one or more steps in the separate processes were combined, the overall cost and complexity of manufacture would be reduced. These complex processes do not use conventional self-aligned contact techniques and include more steps for manufacturing SOC devices.

SUMMARY

The present invention relates to processes for the fabricating embedded vertical DRAM cells and dual work function logic gates. In particular, it relates to a novel process for the fabrication of very high-density DRAM and very high-performance support MOSFETs. It overcomes inefficiencies in the prior art by combining certain steps in the DRAM and logic processes. In particular, the invention forms the gates of the wordline in the array and the CMOS logic gates at the same time.

The invention provides a method for forming wordlines in a memory array area and dual function logic gates in a support area on a semiconductor substrate using self-aligned contact techniques. The process steps include forming vertical dram cells in the array area of the substrate in a conventional manner. Any suitable known or later invented DRAM process is sufficient. After the array devices are formed, a top oxide layer covers the array and a gate oxide layer covers the support. Then the substrate is processed to provide the gate layers for the array and the support devices.

In one embodiment a layer of undoped polysilicon is deposited over the surface of the substrate and removed from the array area. Next, the array gate material is deposited and removed from over the support area. Then a common gate mask is formed over the entire substrate and, using the common gate mask, the gates for the array the support areas are etched from the underlying layers. The invention uses self-aligned contact techniques and does not require salicided bit lines.

In one embodiment the support area is covered with undoped polysilicon and a hard mask layer of silicon dioxide. The hard mask layer may be deposited or formed by thermal oxidation. The polysilicon and the oxide hard mask are removed from over the array area. Wordline material is deposited over the substrate and a layer of silicon nitride is deposited over the wordline material. Typical wordline materials are tungsten silicide, titanium disilicide or tungsten/tungsten nitride. The wordline material and the silicon nitride layer are removed from over the support area. Then a soft mask material, such as photoresist, is applied to the nitride and oxide layers and is patterned to form a gate mask. Portions of the photoresist are removed to expose the underlying silicon nitride and silicon dioxide layers. The exposed portions are subjected to one or more plasma etches that remove the underlying nitride, oxide, polysilicon and wordline layers to form the gate structures in the array and support areas. There are known etching materials that remove both silicon nitride and silicon dioxide. There are other etching materials that remove polysilicon and W/Wn but are selective with regard to silicon nitride or silicon dioxide. The gate etching stops on the top oxide layer and gate oxide layer of the arrays and support areas, respectively.

The array devices and the support devices of one work function (e.g. N-type) are masked and the other work function devices (e.g. P-type) are implanted to form P+ gate polysilicon and P+ source and drain regions. Then the process is reiterated over the other support devices to form the N+ polysilicon gates and N+ sources and drains. A sidewall oxide spacer layer is formed over the support area and openings are made to define the source and drain regions. The sidewall oxide layer fills the spaces between the wordlines. The support area sources and drains are salicided with a suitable metal, such as cobalt, to increase their electrical conductivity. That saliciding does not affect the array devices. The SOC is completed in a conventional manner by depositing an interlevel dielectric, planarizing the interlevel dielectric, opening vias in the interlevel dielectric to expose surface contact regions, and depositing a conductive layer that fills vias and makes electrical contact with the contact surfaces exposed in the vias.

DETAILED DESCRIPTION

Figure 1:
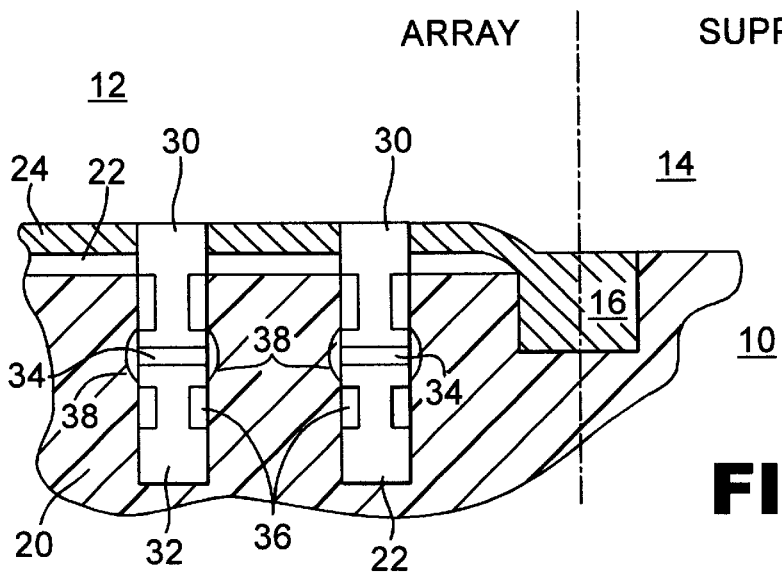
FIGS. 1–7 are sequential cross sections of a substrate where dual function work gates are formed in a support area and vertical drams are formed in an array area.
Figure 2:
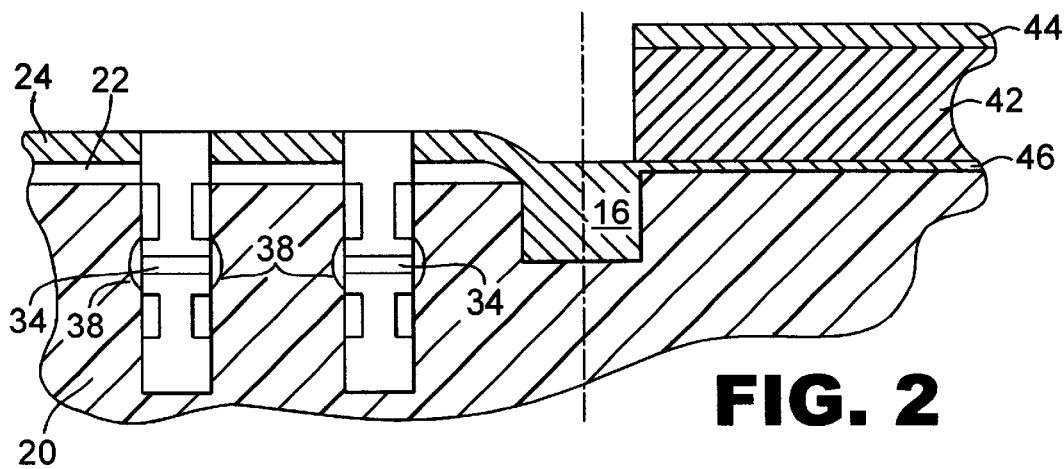
Figure 3:
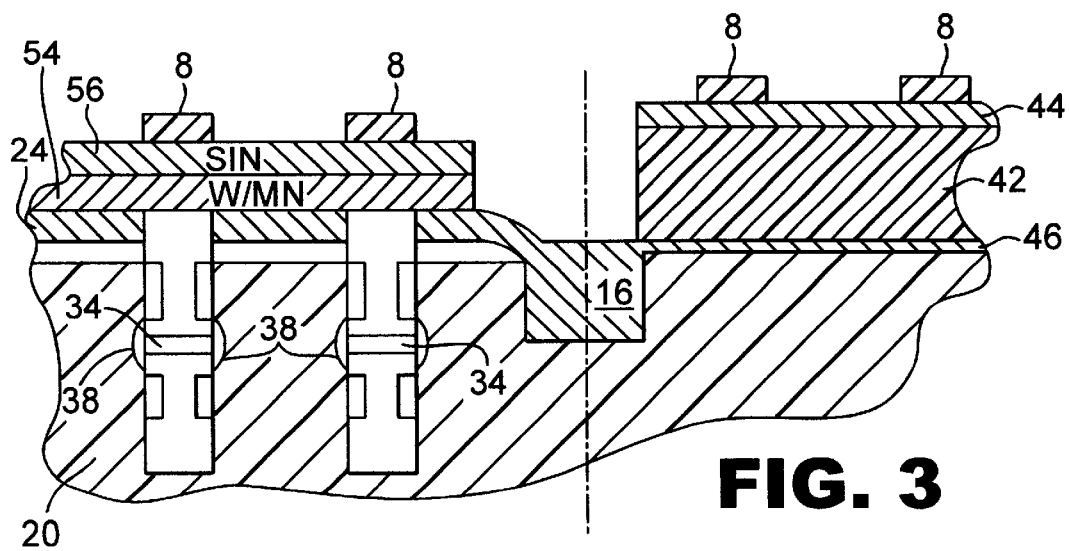
Figure 4:
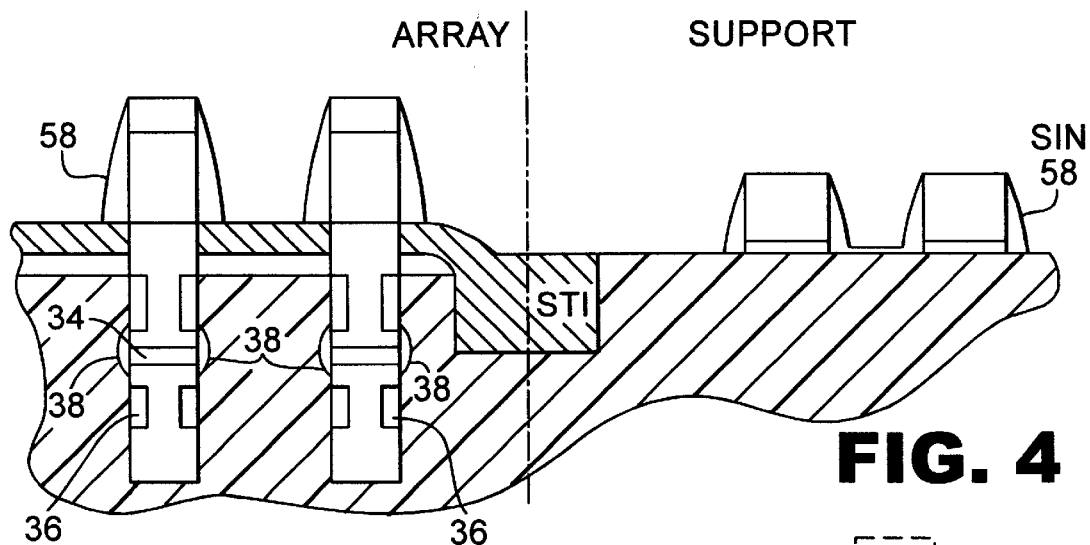

The present invention provides various processes of forming self-aligned bitline contacts and dual work function high-performance supports with conventional DRAMS arrays. It will now be described in more detail by referring to the drawings that accompany the present application. It should be noted that in the accompanying drawings, like reference numerals are used for describing like and corresponding elements.

Reference is first made to FIGS. 1–7 that illustrate the various processing steps employed in a first embodiment of the present invention. FIG. 1 illustrates an initial memory structure 10 that can be employed in the present invention. Specifically, the initial device structure shown in FIG. 1 comprises an array region 12 and a support region 14. Although the drawings depicted the presence of only one of each region in the structure, the integrated circuit structure may include any number of array regions and support regions therein. As illustrated, array region 12 is separated from support region 14 by shallow trench isolation (STI) region 16. In accordance with the present invention, the isolation region includes a surface step region 17 which is formed during the fabrication of the same. Although the drawings depict the isolation region as a shallow trench isolation region the invention is not limited to just STI regions. Instead, other means of electrically separating the array region from the support region such as LOCOS (local oxidation of silicon) are also contemplated herein.

The array region of FIG. 1 includes a plurality of vertical DRAMs 20, two of which are shown, in the drawing, embedded in substrate 18. The substrate material is silicon but may be any other semiconductor material including and not limited to such materials a Ge, SiGe, GaAs, InAs and other like semiconductors. Layered semiconductors such as Si/SiGe and Silicon-On-Insulators (SOIs) are also contemplated herein. The substrate in the array region may also include a well region which is formed utilizing conventional ion implantation. For clarity, the array well region is not shown in the drawings of the present invention.

Array region 12 also includes a bitline diffusion region 22 that is formed in semiconductor substrate 18 between two adjacent vertical DRAMs. On top of the bitline diffusion as well as other exposed surfaces of the semiconductor substrate is a layer of oxide 24 which is referred to hereinafter as the array top oxide or ATO for short. As shown, ATO layer 24 is formed on the upper portion of the semiconductor substrate which does not include the DRAMs.

Each DRAM includes a gate conductor 30 formed in the top portion of a deep trench and deep trench highly doped polysilicon 32, which is formed in the lower portion of the deep trench. Separating the gate conductor and the deep trench highly doped polysilicon is a trench top oxide layer 34. Each DRAM includes an insulating collar region 36 and a buried out-diffused strap region 38. See FIG. 8. With this configuration, the access transistor includes the bitline diffusion 22, a gate insulating layer 3, a doped polysilicon gate 30, and strap diffusion region 38. The oxide layer 34 separates the access transistor from the storage capacitor. A layer of silicon nitride (not shown) lines the sidewalls and floor of the trenches below the collar oxide 36. The nitride layer is the capacitor dielectric and it separates the doped polysilicon fill 32 from the substrate 18. The fill 32 forms one of the plates of the storage capacitor and the substrate the other plate. The present invention is not limited to the exact memory structure shown in FIG. 1. That is, the DRAM cells may also include a buried exterior counterelectrode about the trench, or a counterelectrode formed inside the trench and a node dielectric formed on said counterelectrode. Deep trench polysilicon is formed on the node dielectric. Other memory structures which include the above basic elements, but having a different configuration are also contemplated herein, including and not limited to those shown and described in U.S. Pat. Nos. 6,261,894 and 6,258,659. The disclosures of those patents are incorporated by reference.

Figure 7:
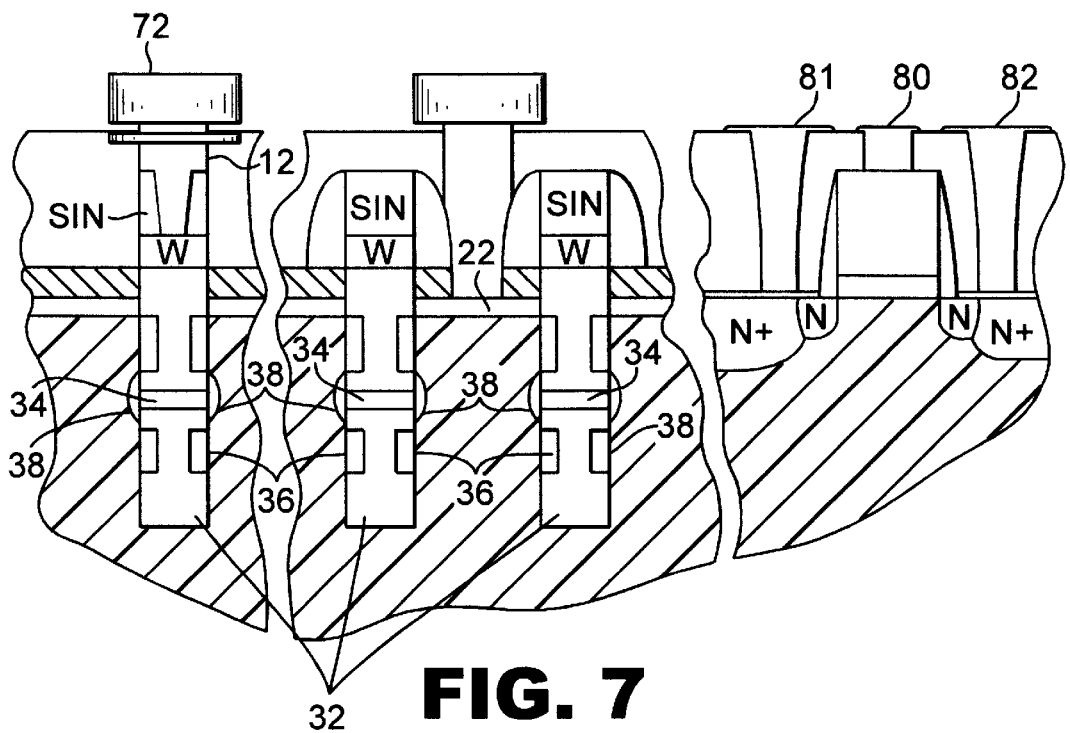
Figure 8:
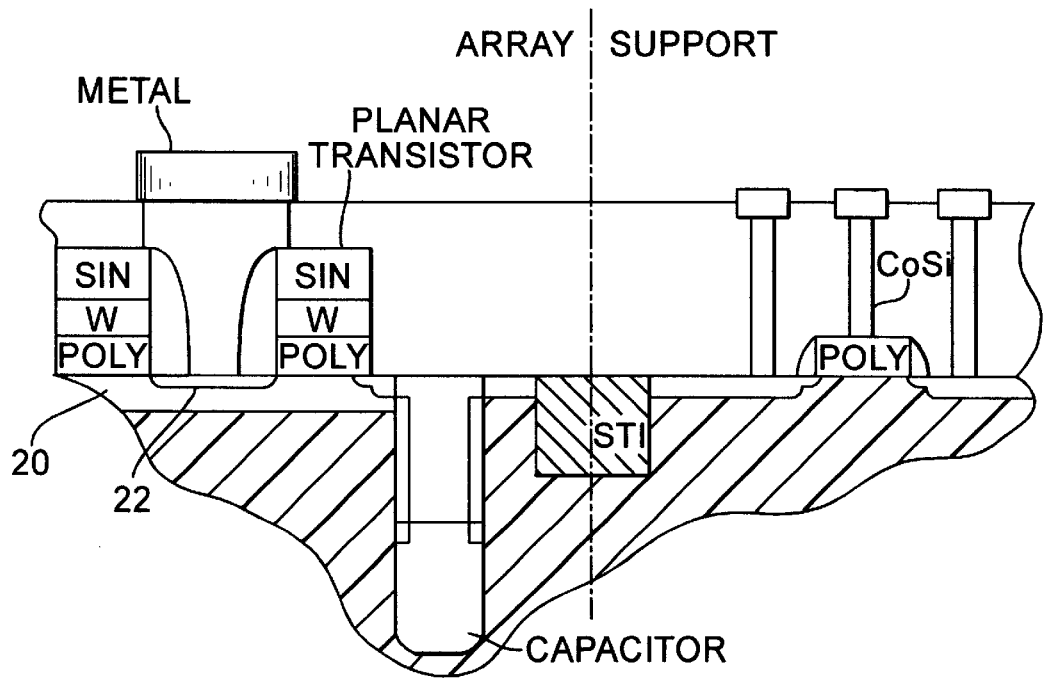
FIG. 8 is a partial cross sectional of a planar dram with a trench capacitor made with the method of the invention.

The memory structure shown in FIGS. 1, 7, and 8 is fabricated utilizing conventional processing techniques that are well known to those skilled in the art. The vertical dram cells include a vertical transistor and capacitor 32. The transistor has a double sided strap 38 that connects one end to the capacitor 32. Those skilled in the art understand that the transistor may also used a one sided strap. The resulting device has a self-aligned (borderless) bit line contact 70. The wordline contact 72 passes through the silicon nitride cap 56 to contact the tungsten layer on the top of the transistor 54. Since the processing steps for forming the vertical and planar transistors are well known, a detailed description of the same is not provided herein. FIGS. 1–7 illustrate the memory structure after various layers have been formed in the support and array regions. Specifically, the memory structure of FIG. 2 includes a support device gate insulating layer 46, an undoped polysilicon layer 42 on top of the gate oxide layer 46. The structure of FIG. 2 also includes a hard mask layer 44 formed on top of the entire structure in both the array and support regions. It is also possible to have a combination of dielectrics for layer 44 to simplify further processing. For example, dielectric 44 can be a layer of tetraethylorthosilicate (TEOS) capped with SiN. A layer of photoresist (not shown) is deposited and patterned to protect the support 14 and to remove the hard mask and polysilicon from over the array 12 to provide the structure of FIG. 3. The photoresist is stripped and a layer of wordline material comprising a metal, in particular tungsten or an alloy such as tungsten/tungsten nitride, tungsten silicide or titanium disilicide is deposited by chemical vapor deposition, sputtering or other suitable means. The metal layer 54 is covered with a layer of silicon nitride 56. Another layer of photoresist is deposited and patterned to protect the array 12 and the W/WN and nitride layers are removed from over the support 14. The layer is suitable processed to provide a planar surface over the entire substrate.

A further layer of photoresist 8 is deposited and pattered to provide openings that will define the gates of the support 14 and the wordlines of the array 12. See FIG. 3. The patterned surface is them dry or plasma etched to remove the exposed silicon nitride and hard mask. There are a number of etching materials that will remove one or both nitride and oxide at the same time. The surface is further etched with a metal etch to remove the exposed metal and polysilicon. The latter etch operation stops on the top oxide 24 and the gate oxide 46. As such, a single mask is used to pattern the final structures for the wordlines and the support gates.

Figure 5:
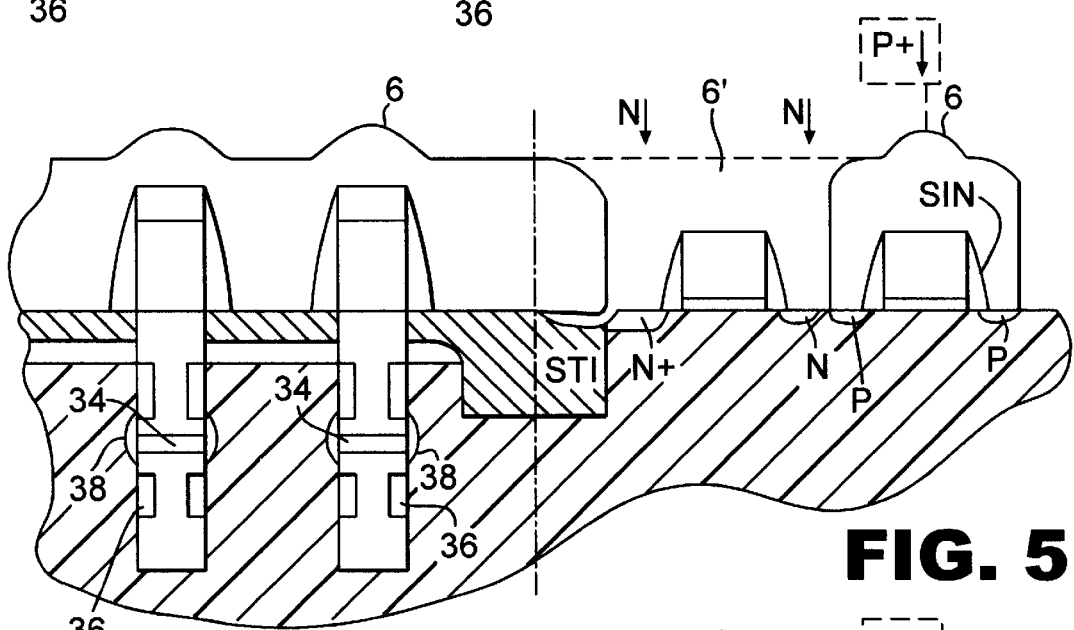
Figure 6:
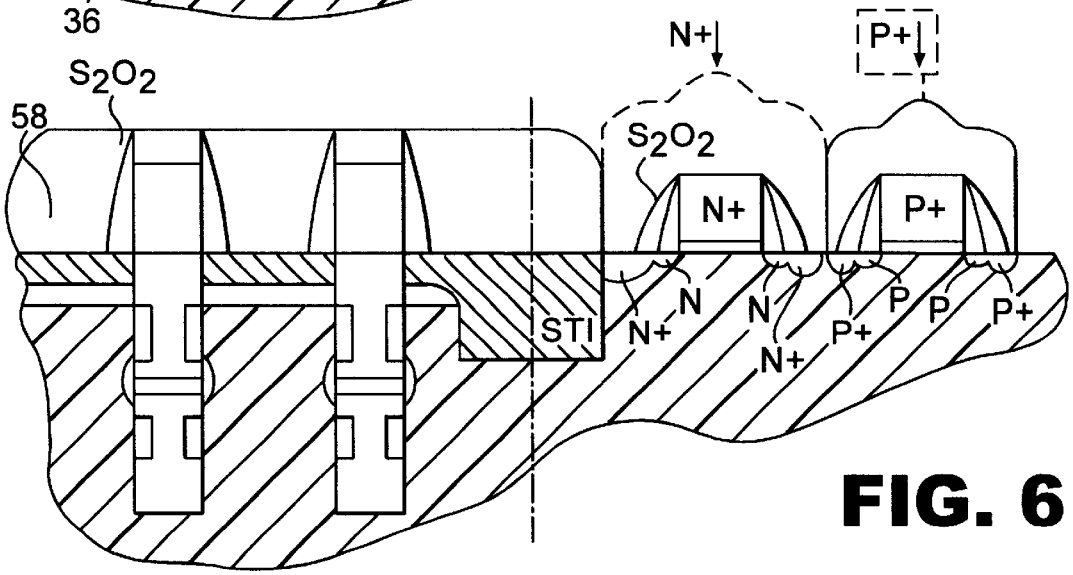

The photoresist is stripped and a layer of silicon nitride is deposited and etched to provide sidewall nitride (SiN) sidewall spacers 58 on the sides of the gate structures in the array and the support. The nitride layer is removed from the lateral surfaces in order to expose source and drain implant regions in the support array. Light implants of N and P dopants are made to form lightly doped source and drain regions. See FIG. 4. Suitable photoresist layers 6, 6' are deposited and patterned to form masks for the implants. Then the resists 6, 6' are removed and a sidewall oxide layer 58 is deposited. Because the wordlines are closer together than the support gates, the spaces between the wordlines are filled with the sidewall layer. Layer 58 is suitably patterned in a manner well known in the art to provide sidewall spacers on the support devices. As shown in FIG. 5, the substrate is first masked with patterned photoresist to form one of the work function gates. The exposed support devices are heavily implanted with a first ion implant, such as boron, to form P+ doped gates, sources and drains in the first work function devices. The photoresist is stripped and another resist layer is deposited and pattered to open areas of the N-type devices. Those areas are implanted with arsenic or phosphorous to form the other work function devices. The rest of the fabrication is conventional fabrication. The tops of the gates and sources and drains are covered with a layer of cobalt that is reacted to form silicide contact layers. See FIG. 7. An interlevel dielectric 82 (BSPG) is deposited and patterned to open surface, gate, and wordline contact regions. A suitable metal layer is deposited and pattered to make electrical contact to the exposed surface, gate and wordline contact regions.

A planar dram cell can also be made with the invention. See FIG. 8. That structure was formed by using steps for depositing a gate oxide, depositing intrinsic (undoped) polysilicon, applying a hard oxide mask. The hard mask is removed from the array and the dram transistors are implanted with phosphorus. Next layers of W or WSi and SiN are depositied. Those layers are masked and removed from over the support array. As described above, the gates of the array and the support transistor are etched using a common etch to pattern the wordline in the array and the logic gates in the support. One the gates are formed, the dual work function devices in the support are made by the steps described above for the trench transistor embodiment. Thereafter conventional process steps are performed to complete the integrated circuit.

Those skilled in the art with understand that further changes, modifications, additions and omissions to the above described devices and processes may be made without departing from the spirit and scope of the invention as set forth in the claims. For example, the order of the steps of forming the array gates and the wordline layers may be changed. Likewise, the N-typed devices may be formed before the P-type devices are made. Finally, the particular structure of the array dram 20 is not critical and other vertical dram structures may be substituted for the one described above.

What is claimed is:

1. A method for forming wordlines in a memory array area and dual function logic gates in a support area on a semiconductor substrate including the steps of:

forming vertical dram cells in the array area of the substrate;

depositing a layer of undoped polysilicon over the surface of the substrate;

removing the undoped polysilicon from over the memory array;

depositing a layer of wordline material over the surface of the substrate;

removing the wordline material from over the logic devices;

applying a gate mask to the surface of the substrate;

using the same gate masks applied in the prior step, selectively removing portions of the unmasked wordline material and portions of the unmasked undoped polysilicon to form wordlines for the memory array and gates for the logic array.

2. The method of claim 1 wherein the step of forming dram cells includes forming vertical transistor dram cells.

3. The method of claim 1 wherein the step of forming dram cells includes the step of forming dram cells with planar transistors and trench capacitors.

4. The method of claim 1 wherein the wordline material is W/Wn.

5. The method of claim 1 further comprising the steps of forming a hard mask of a first material over the support area and a hard mask of a second material over the array area.

6. The method of claim 5 wherein the first material is silicon dioxide and the second material is silicon nitride.

7. The method of claim 5 comprising the further step of forming a softmask of photoresist material over the hard mask materials and defining the photoresist material to expose selective portions of the underlying hard mask materials.

8. The method of claim 7 comprising the further step of plasma etching the exposed hard mask material until portions of the underlying wordline and gate materials are exposed.

9. The method of claim 8 comprising the further step of removing the photoresist material and etching the exposed wordline and gate materials using the residual hard mask layer to pattern the wordline and the gates.

10. The method of claim 7 comprising the further step of removing the hard mask material from over the gates.

11. The method of claim 10 comprising the further steps of masking p-type devices and implanting the gates, sources and drains of n-type devices with n-type implants; and masking n-type devices and implanting the gates, sources and drains of p-type device with p-type implants.

12. The method of claim 11 comprising the further step of forming insulating sidewall layers on the sides of the logic gates.

13. The method of claim 12 wherein following the step of sidewall forming, depositing a metal on the gates, source and drains of the logic devices and siliciding the gates, sources and drains of the logic devices.

14. The method of claim 13 wherein the metal is cobalt.

15. The method of claim 14 further comprising the steps of depositing an interlevel dielectric, planarizing the interlevel dielectric, opening vias in the interlevel dielectric to expose surface contacts, and depositing a conductive layer for filling the vias to make electrical contact to the contact surfaces exposed in the vias.

16. The method of claim 1 comprising the further steps of:

masking p-type devices and implanting the gates, sources and drains of n-type devices with n-type implants; and masking n-type devices and implanting the gates, sources and drains of p-type device with p-type implants.

17. The method of claim 1 comprising the further step of forming insulating sidewall layers on the sides of the logic gates.

18. The method of claim 17 wherein following the step of sidewall forming, depositing a metal on the gates, source and drains of the logic devices and siliciding the gates, sources and drains of the logic devices.

19. The method of claim 18 wherein the metal is cobalt.

20. The method of claim 18 further comprising the steps of depositing an interlevel dielectric, planarizing the interlevel dielectric, opening vias in the interlevel dielectric to expose surface contacts, and depositing a conductive layer for filling the vias to make electrical contact to the contact surfaces exposed in the vias.

* * * * *